(12) United States Patent
Pirkle

(10) Patent No.: US 7,334,477 B1
(45) Date of Patent: Feb. 26, 2008

(54) APPARATUS AND METHODS FOR THE DETECTION OF AN ARC IN A PLASMA PROCESSING SYSTEM

(75) Inventor: David Pirkle, Soquel, CA (US)

(73) Assignee: Lam Research Corporation, Fremont, CA (US)

( * ) Notice: Subject to any disclaimer, the term of this patent is extended or adjusted under 35 U.S.C. 154(b) by 12 days.

(21) Appl. No.: 11/023,174

(22) Filed: Dec. 22, 2004

(51) Int. Cl.
G01H 1/12 (2006.01)
G01N 29/14 (2006.01)

(52) U.S. Cl. ............... 73/587; 219/121.59; 219/121.43

(58) Field of Classification Search ............... 73/579, 73/587
See application file for complete search history.

(56) References Cited

U.S. PATENT DOCUMENTS

| | | | |
|---|---|---|---|
| 6,753,499 B1 * | 6/2004 | Yasaka et al. | 219/121.59 |
| 6,866,744 B2 * | 3/2005 | Miya et al. | 156/345.24 |
| 2001/0045416 A1 * | 11/2001 | Sokol et al. | 219/121.62 |
| 2003/0008597 A1 * | 1/2003 | Tseng | 451/6 |
| 2005/0194094 A1 * | 9/2005 | Yasaka | 156/345.28 |
| 2005/0223805 A1 * | 10/2005 | Ganesan et al. | 73/587 |

FOREIGN PATENT DOCUMENTS

EP 1189491 A1 * 3/2002

OTHER PUBLICATIONS

Cistola, AB, "Sputtering Target Rework Process", Aug. 1, 1983, IBM TDB, vol. 26, Issue 3A, p. 1042.*
Degertekin et al., "In situ acoustic temperature tomography of semiconductor wafers," American Institute of Physics, 1994, Appl. Phys. Lett. 64 (11), Mar. 14, 1994, pp. 1338-1340.
Murray et al., "A laser/EMAT system for thickness monitoring applications using shear and L-S mode-converted waves," Meas. Sci. Technol. 12(2001) pp. 1651-1652.
Klimek et al., "Laser Ultrasonic Instrumentation for Accurate Temperature Measurement of Silicon Wafers in Rapid Thermal Processing System," Mat, Res, Soc. Symp. Proc. vol. 525, 1998 Materials Research Society, pp. 135-140.
Thurston et al., *Ultrasonic Measurement Metods: Physical Acoustic XIX*, Academic Press 1990, p. 258.

* cited by examiner

*Primary Examiner*—Hezron Williams
*Assistant Examiner*—Rose M Miller
(74) *Attorney, Agent, or Firm*—IP Strategy Group, PC

(57) ABSTRACT

In a plasma processing system, a method for detecting an arc event on a substrate in a plasma chamber having a chuck is disclosed. The method includes positioning a substrate on the chuck. The method also includes providing a vibration-sensing arrangement in the plasma chamber, the vibration-sensing arrangement being configured for measuring arc-induced vibrations on the substrate, the arc-induced vibrations being generated when an arc strikes the substrate during plasma processing of the substrate in the plasma processing chamber.

26 Claims, 7 Drawing Sheets

APPARATUS AND METHODS FOR THE DETECTION OF AN ARC IN A PLASMA PROCESSING SYSTEM

BACKGROUND OF THE INVENTION

The present invention relates in general to substrate manufacturing technologies and in particular to apparatus and methods for the detection of an arc in a plasma processing system.

In the processing of a substrate, e.g., a semiconductor substrate or a glass panel such as one used in flat panel display manufacturing, plasma is often employed. The semiconductor or glass substrate is processed in a series of steps in which materials are deposited and materials are selectively removed using plasma processes A layer of particular material is deposited on the substrate, often using plasma to enhance the deposition process. Subsequently, the layer is patterned with a polymer mask using photolithography. The substrate is then placed in a plasma processing chamber on a substrate support structure comprising a mono-polar or bi-polar electrode, called a chuck or pedestal. Appropriate etchant gases then flow into the chamber and energized to form a plasma to etch exposed areas of the substrate.

Integrated circuits manufactured by these plasma processes now incorporate feature sizes as small as 100 nm, and as many as seven layers of material that is alternately deposited and patterned with these small features. The high density of components in these advanced integrated circuits increases the risk of dielectric breakdown and arcing between the components, or between the components and the plasma during plasma processing. Plasma arcs are generally caused by low plasma impedance which results in a steadily increasing current flow. If the resistance is low enough, the current will increase indefinitely (limited only by the power supply and impedance), creating a short circuit in which all energy transfer takes place. This may result in damage to the substrate as well as the plasma chamber. Often, the occurrence of an arc event is easy to determine since it measurably affects plasma process parameters, such as RF power or emission spectroscopy.

However, an arc can occur that neither consumes enough energy nor exists for a sufficient length of time to generate a distinguishable signal from the background plasma process noise (e.g., signal-to-noise ratio). These "micro-arcs" are more likely on the high-density multi-level circuits currently being manufactured. Such arcing can still cause failure of the circuit being manufactured and collateral damage to other circuits and portions of the substrate.

For example, the RF power used to sustain a plasma processing system is on the order of kilowatts; however, a small arc event on the substrate being processed can be on the order of watts. Subsequently, the arc event may be masked by normal multi-watt fluctuations in the plasma processing. Likewise, the small perturbation of the plasma light intensity due to the arc is less than the normal intensity fluctuations in the plasma; hence, spectroscopic detection of the arc also has poor signal-to-noise ratio. On the other hand, even a micro-arc generally has enough power density to effect a miniature explosion on the substrate. The vaporization of material creates vibrations in the substrate.

Unfortunately, the method often used to determine the extent of damage caused by an arc event, or if in fact an arc event actually occurred, is visually inspecting the surface of the substrate outside of the plasma chamber. Since the inspection cannot be done in-situ, it is generally performed only after a batch of substrates has been processed. At later stages of manufacturing, after a substantial amount of resources has been invested in each substrate, scraping an entire batch can be particularly costly, often on the order of several hundred thousand dollars.

In view of the foregoing, there are desired improved apparatus and methods for the detection of an arc in a plasma processing system.

SUMMARY OF THE INVENTION

The invention relates, in one embodiment, in a plasma processing system, to a method for detecting an arc event on a substrate in a plasma chamber having a chuck. The method includes positioning a substrate on the chuck. The method also includes providing a vibration-sensing arrangement in the plasma chamber, the vibration-sensing arrangement being configured for measuring arc-induced vibrations on the substrate, the arc-induced vibrations being generated when an arc strikes the substrate during plasma processing of the substrate in the plasma processing chamber.

The invention relates, in one embodiment, in a plasma processing system, to an apparatus for detecting an arc event on a substrate in a plasma chamber having a chuck. The apparatus includes means for positioning a substrate on the chuck. The apparatus also includes means for providing a vibration-sensing arrangement in the plasma chamber, the vibration-sensing arrangement being configured for measuring arc-induced vibrations on the substrate, the arc-induced vibrations being generated when an arc strikes the substrate during plasma processing of the substrate in the plasma processing chamber.

The invention relates, in one embodiment, to an apparatus for detecting an arc event in a plasma processing chamber, including a chuck configured to support a substrate during plasma processing. The apparatus includes a vibration-sensing arrangement in the plasma chamber, the vibration-sensing arrangement being configured for measuring arc-induced vibrations on the substrate, the arc-induced vibrations being generated when an arc strikes the substrate during plasma processing of the substrate in the plasma processing chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, the inventor believes that the characteristic vibration caused by an arc event, together with subsequent vibrations caused by that arc event on a substrate, can be measured in order to determine in-situ the occurrence of the arc event. That is, the frequency of the vibration signal caused by the arc may be easily distinguishable, and hence isolated, from the frequencies and shapes of large acoustic signals on the plasma processing system itself. Embodiments of the present invention measures mechanical vibrations that are a direct effect of the arc on the substrate.

In addition, embodiments of the current invention may allow specific plasma processing parameter ranges to be better optimized. Process recipes are generally designed with safety margins in order to account for dynamic plasma processing conditions. However, often the only way that a complex substrate film stack can be successfully achieved is to substantially narrow the safety margins, which may also aggravate the likelihood of arcing. By enabling the immediate in-situ detection of a damaging arc event, process parameter windows can be optimized to accommodate more complex substrate film stacks while reducing the likelihood that an entire batch of expensive substrates will become damaged.

Figure 1:
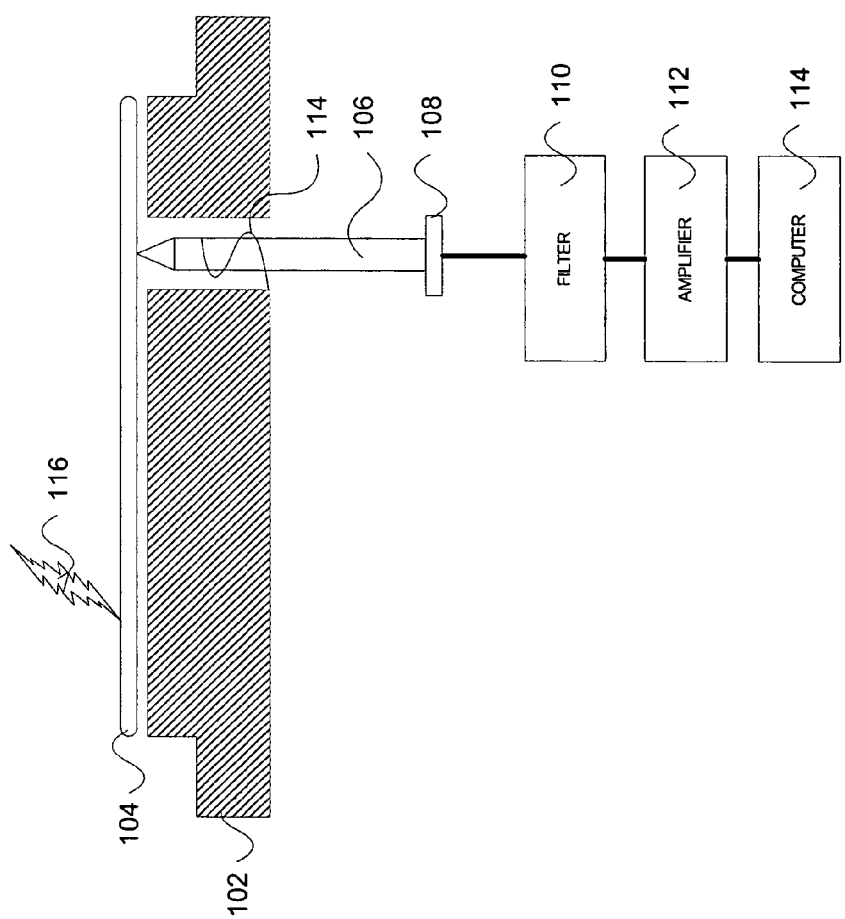
FIG. 1 shows a simplified diagram of an arc detection apparatus comprising a vibration measuring structure, in which a rod with a "lossy" spring makes contact with a bottom surface of a substrate in a plasma processing chamber, according to one embodiment of the invention.

Referring now to FIG. 1, a simplified diagram of an arc detection apparatus comprising a "lossy" biasing arrangement, in which a rod with a "lossy" spring makes contact with a bottom surface of a substrate in a plasma processing chamber, while isolating the rod from other plasma processing components (i.e., chuck, etc.) vibrations, according to one embodiment of the invention. In general, the bottom surface of substrate 104 is located between substrate 104 and chuck 102, when substrate 104 is placed on chuck 102.

When arc event 116 occurs on substrate 104, the characteristic arc-induced vibration and subsequent vibrations generated may be transmitted from substrate 104 through rod 114 to a sensor 108. The electrical signal from the transducer may then be processed through filter 110 in order to distinguish the vibrations caused by arc event 116 from the background plasma processing noise, amplified at 112, and then analyzed by computer 114. When arc event 116 is detected, a signal may be produced to alert the operator of the plasma processing equipment.

By positioning the rod and ancillary attachments under the substrate and away from the plasma environment, the embodiment of FIG. 1 advantageously reduces the risk of plasma-induced damage to the vibration measurement arrangement. Furthermore, since the rod is not present on the substrate surface where plasma processing takes place, any shadow effect, magnetic effect, and/or thermal effect on the etch result that may be attributable to the rod presence is advantageously minimized. As shown in FIG. 1, the sensing rod is positioned in an aperture in the chuck to contact the underside of the substrate. This arrangement renders the temperature of the probe to be substantially similar to the temperature of the surrounding chuck material. From a thermal standpoint, there is little change in temperature between the probe tip and the surrounding chuck, thereby ensuring that the presence of the probe tip contacting the underside of the substrate does not unduly affect the etch result.

In an embodiment, rod 106 may be pressed against substrate 104 by one end of "lossy" spring 114. That is, spring 114 preferably has a high absorption coefficient with respect to the vibrations experienced by spring 114. In this manner, "lossy" spring 114 will transmit little, if any, of the environmental vibrations experienced by chuck 102, allowing sensor 108 to receive substantially only the vibrations experienced by substrate 114 (which includes the vibrations caused by arch event 116) and transmitted via rod 106. In yet another embodiment, one end of spring 114 may be attached to the same structure that holds the substrate, such as chuck 102.

In another embodiment, sensor 108 is a mechanical-to-electrical transducer. In another embodiment, sensor 108 may be a spring is attached to a high-sensitivity, high-frequency microphone. In another embodiment, sensor 108 is a piezo-electric stress/strain gauge. In another embodiment, rod 106 may be made of quartz. In another embodiment, rod 106 may be made of alternative materials to quartz, such as glass, ceramic, wood, metal, yttrium, cerium, zirconium, Teflon, Vespel, ruby, plastic, etc.

In an embodiment, the wafer-contact vibration-sensing arrangement that includes rod 106, spring 114, and transducer 108 may be replaced by a non-contact measurement arrangement such as a laser measurement apparatus or a light interferometry apparatus. Non-contact measurements are preferred in some applications since such measurement techniques tend to introduce little, if any, thermal or electrical/magnetic perturbation to the substrate and/or the overlying plasma environment. As a consequence, it is possible to employ these non-contact measurement arrangements on any portion of the substrate, including not only from under the substrate as shown in FIG. 1 but also from the top surface of the substrate or from the side of the substrate.

Figure 5:
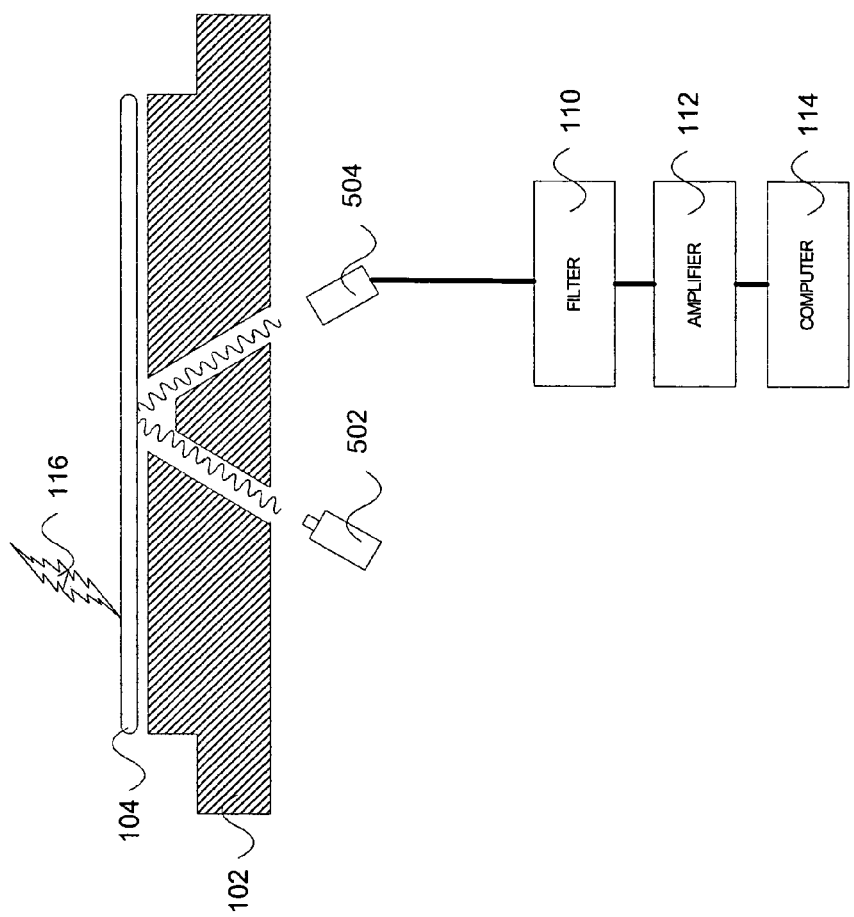
FIG. 5 shows a simplified diagram of an arc detection apparatus with an interferometric sensor, according to one embodiment of the invention.

For example, a laser measurement apparatus may be configured to emit one or more beams of laser at substrate 104, either though an aperture in the chuck as is shown in FIG. 1 or from one side of the substrate or even from the top. FIG. 5 also discusses light interferometry as another non-contact measurement technique for measuring the vibration experienced by the substrate. These and other sensor arrangements and mechanisms are possible as long as they can convert the vibrations experienced by wafer 104 due to the occurrence of an arc event to an electrical signal to be measured and/or analyzed.

Computer 114 may contain an algorithm to analyze the amplitude and/or frequency and/or phase of the signal coming from the transducer 108, and to "recognize" an arcing event. Such recognition may rely, for example, on the characteristic shape of a vibration signal produced as an instantaneous response to an arc strike, followed by the shape of the decaying vibration signal as the initial vibration is damped away. The detection of a particular pattern of the amplitude, frequency, and/or phase signal in the real or frequency domain is well known to those familiar to the signal processing art. When the computer algorithm recognizes an arc event, the computer may notify the user by posting a message on the video monitor, and/or activating a light or siren, and/or sending a short message service or an email or any number of electronic means of alerting the operator of the operating system.

Figure 2:
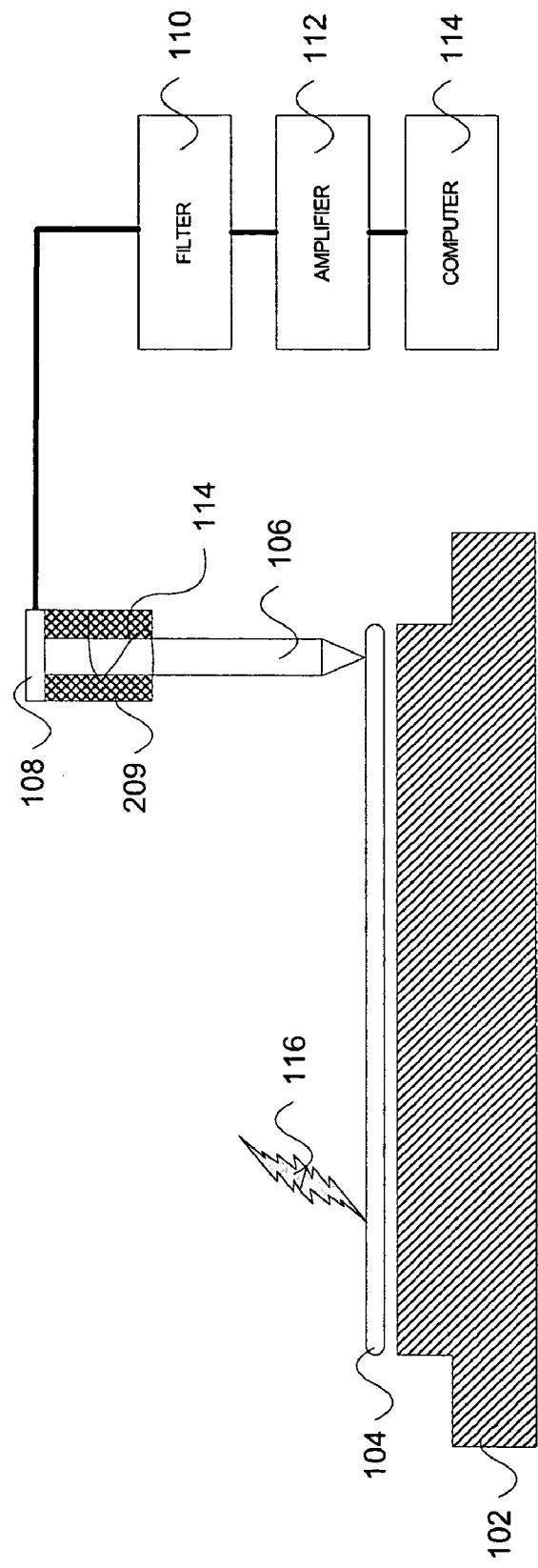
FIG. 2 shows a simplified diagram of an arc detection apparatus in which a rod with a "lossy" spring makes contact with a top surface of a substrate in a plasma processing chamber, according to one embodiment of the invention.

Referring now to FIG. 2, a simplified diagram of an arc detection apparatus comprising a "lossy" biasing arrangement, in which a rod with a "lossy" spring makes contact with a top surface of a substrate in a plasma processing chamber, according to one embodiment of the invention. In general, the top surface of substrate 104 is located between substrate 104 and the plasma [not shown], when substrate 104 is placed on chuck 102.

As in FIG. 1, when arc event 116 occurs on substrate 104, the subsequent vibrations generated may be transmitted from substrate 104 through rod 114 to a sensor 108. In one embodiment, spring 114 may be attached to support structure 209 that is attached to a surface of the plasma processing chamber [not shown] and which holds substrate 104.

Figure 3:
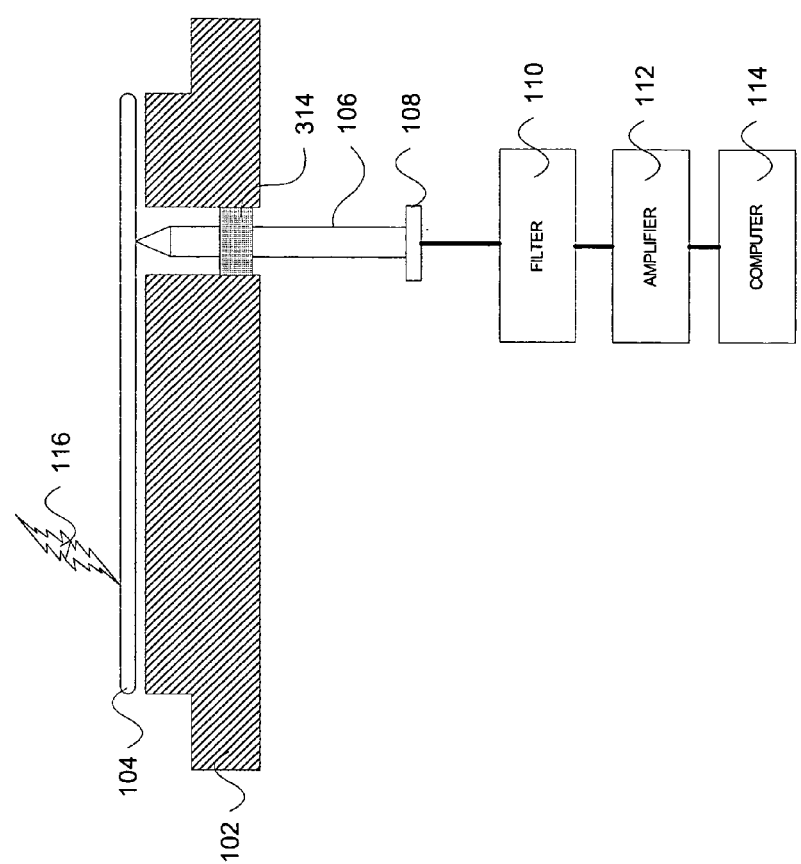
FIG. 3 shows a simplified diagram of an arc detection apparatus in which a rod, with a resilient material instead of a "lossy" spring, makes contact with a bottom surface of a substrate in a plasma processing chamber, according to one embodiment of the invention.

Referring now to FIG. 3, a simplified diagram of an arc detection apparatus in which a rod, with a resilient collar instead of a "lossy" spring, makes contact with a bottom surface of a substrate in a plasma processing chamber, according to one embodiment of the invention. In one embodiment, resilient material 314 may be foam rubber or plastic and serves to bias the tip of rod against the substrate to be sensed.

Figure 4:
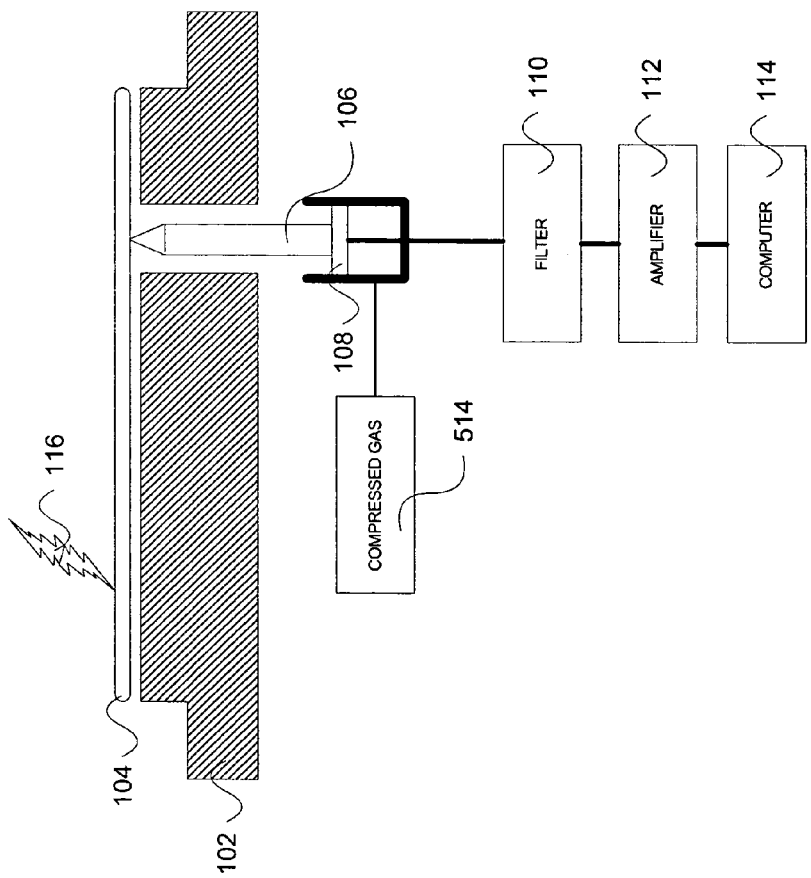
FIG. 4 shows a simplified diagram of an arc detection apparatus in which a rod, with compressed gas instead of a "lossy" spring, makes contact with a bottom surface of a substrate in a plasma processing chamber, according to one embodiment of the invention.

Referring now to FIG. 4, a simplified diagram of an arc detection apparatus in which a rod, with compressed gas instead of a "lossy" spring as the biasing force, makes contact with a bottom surface of a substrate in a plasma processing chamber, according to one embodiment of the invention. That is a compressed gas 514 may hold rod 106 against substrate 104.

Referring now to FIG. 5, a simplified diagram of an arc detection apparatus with an interferometric sensor, according to one embodiment of the invention. For example, in single-wavelength interferometry, a light beam may be directed on the surface of the substrate. The reflected signals from the substrate then combine constructively or destructively to produce a periodic interference fringe, or signature, that may be correlated to arc event 116. The use of light interferometry to measure vibrations is well known and will not be repeated here.

Figure 6:
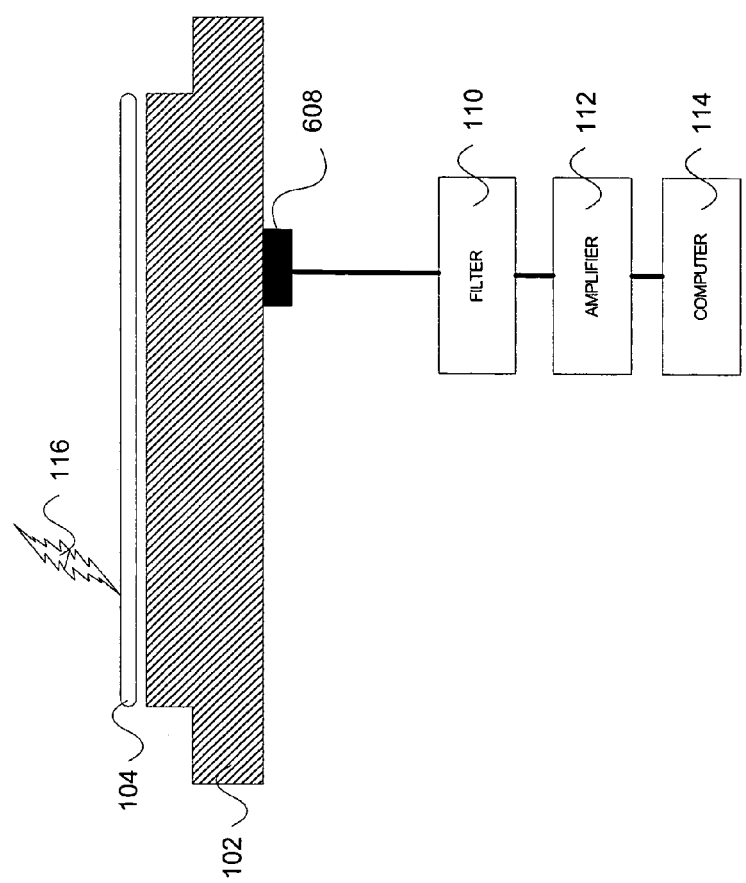
FIG. 6 shows a simplified diagram of an arc detection apparatus in which a sensor is mounted directly on a chuck, according to one embodiment of the invention.

Referring now to FIG. 6, a simplified diagram of an arc detection apparatus in which a sensor is mounted directly on a chuck, according to one embodiment of the invention. When arc event 116 occurs on substrate 104, subsequent vibrations generated may be transmitted from substrate 104 through chuck 102 to sensor 608. The arrangement of FIG. 6 has the advantage of being simple since an aperture through the chuck is not required in order to obtain vibration measurements on the substrate.

Figure 7:
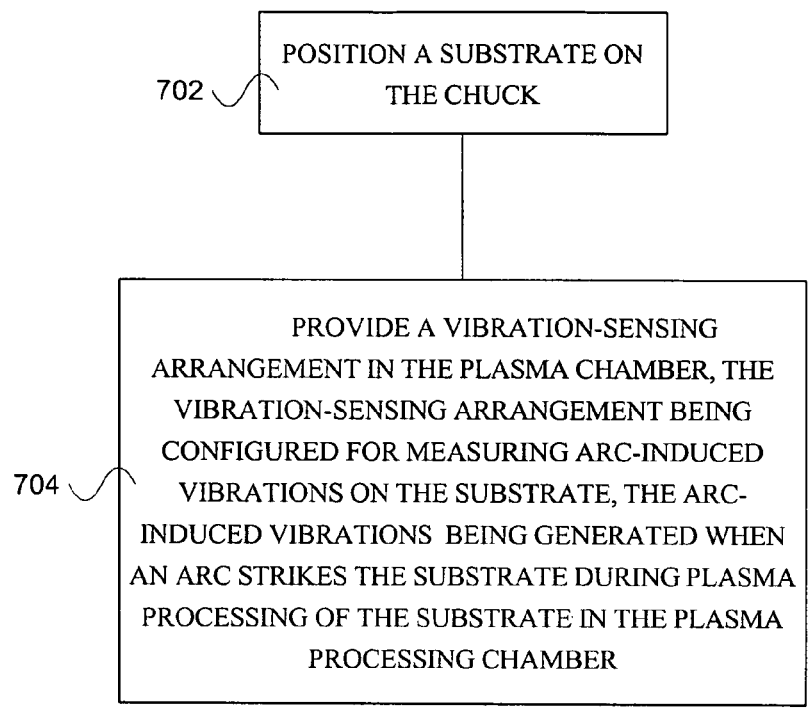
FIG. 7 shows a simplified diagram for a method for detecting an arc event on a substrate in a plasma chamber having a chuck, according to one embodiment of the invention.

Referring now to FIG. 7, a simplified diagram for a method for detecting an arc event on a substrate in a plasma chamber having a chuck. Initially, a substrate is positioned on the chuck, at 702. Next, a vibration-sensing arrangement is provided in the plasma chamber, the vibration-sensing arrangement being configured for measuring arc-induced vibrations on the substrate, the arc-induced vibrations being generated when an arc strikes the substrate during plasma processing of the substrate in the plasma processing chamber, at 704.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, LCD, etc.).

Advantages of the invention may include a more accurate detection of low power arc events, having both fewer "false positive" events and a lower threshold for detecting true arcs on the substrate. False positives are minimized since embodiments of the invention seek to measure the vibration signal that is directly caused by the arc strike. This is unlike the prior art wherein detection of the arc event is performed by indirectly measuring its effect on parameters such as plasma impedance or plasma emission. Additional advantages include the detection of difficult to detect smaller arc events that may produce small signals on a large background level of normal fluctuations. This is because the type of high-frequency vibrations caused by the arc event and measured by the vibration measurement arrangements disclosed herein represents the type of vibrations that is rarely generated by any other event inside the plasma processing chamber. Accordingly, the SNR (Signal-to-Noise) ratio of the arc-related vibration event, when measured, will be large, enabling the computer to easily distinguish an arc-related vibration from other events that occur inside the plasma processing chamber.

Having disclosed exemplary embodiments and the best mode, modifications and variations may be made to the disclosed embodiments while remaining within the subject and spirit of the invention as defined by the following claims.

What is claimed is:

1. In a plasma processing system, a method for detecting an arc event on a substrate in a plasma chamber having a chuck, comprising:

positioning a substrate on said chuck;

providing a vibration-sensing arrangement in said plasma chamber, said vibration-sensing arrangement being configured for measuring arc-induced vibrations on said substrate to detect said arc event on said substrate, said arc-induced vibrations being generated when an arc strikes said substrate during plasma processing of said substrate in said plasma processing chamber, wherein said vibration-sensing arrangement is a contact sensing arrangement, at least a component or said vibration-sensing arrangement physically contacts a portion of said substrate; and providing a result of said arc event to an operator.

2. The method of claim 1 further comprising providing a sensor configured to convert said arc-induced vibrations transmitted through said component to an electrical signal.

3. The method of claim 2 further comprising providing an amplifier and a computer device, said amplifier being configured to convert said electrical signal to an amplified signal, said computer being configured to analyze said amplified signal to detect when said arc strikes said substrate.

4. The method of claim 2 further comprising providing a computer device configured to analyze said electrical signal to detect when said arc strikes said substrate.

5. The method of claim 2 wherein said component is a rod.

6. The method of claim 5 wherein said rod is configured to contact an underside of said substrate, said underside of said substrate representing a chuck-contacting side of said substrate.

7. The method of claim 5 wherein said rod is configured to contact a side of said substrate, said side of said substrate representing a side that is perpendicular to said chuck-contacting side of said substrate.

8. The method of claim 5 wherein said rod is configured to contact a top of said substrate, said top of said substrate representing a side that is opposite and parallel to said chuck-contacting side of said substrate.

9. The method of claim 5 wherein said rod is disposed in an aperture in said chuck.

10. The method of claim 9 wherein said rod is biased against said underside of said substrate using a lossy biasing arrangement, said lossy biasing arrangement being configured to substantially isolate vibrations from other components of said plasma chamber, other than from said substrate, from said rod.

11. The method of claim 10 wherein said lossy biasing arrangement is a spring coupled to said rod.

12. The method of claim 10 wherein said lossy biasing arrangement is a resilient material coupled to said rod.

13. The method of claim 10 wherein said resilient material is one of plastic and rubber.

14. An apparatus for detecting an arc event in a plasma processing chamber, including a chuck configured to support a substrate during plasma processing, comprising:

a vibration-sensing arrangement in said plasma chamber, said vibration-sensing arrangement being configured for measuring arc-induced vibrations on said substrate to detect said arc event on said substrate, said arc-induced vibrations being generated when an arc strikes said substrate during plasma processing of said substrate in said plasma processing chamber, wherein said vibration-sensing arrangement is a contact sensing arrangement, at least a component of said vibration-sensing arrangement physically contacts a portion of said substrate.

15. The apparatus of claim 14 further comprising providing a sensor configured to convert said arc-induced vibrations transmitted through said component to an electrical signal.

16. The apparatus of claim 15 further comprising an amplifier and a computer device, said amplifier being configured to convert said electrical signal to an amplified signal, said computer being configured to analyze said amplified signal to detect when said arc strikes said substrate.

17. The apparatus of claim 15 further comprising a computer device configured to analyze said electrical signal to detect when said arc strikes said substrate.

18. The apparatus of claim 15 wherein said component is a rod.

19. The apparatus of claim 18 wherein said rod is configured to contact an underside of said substrate, said underside of said substrate representing a chuck-contacting side of said substrate.

20. The apparatus of claim 18 wherein said rod is configured to contact a side of said substrate, said side of said substrate representing a side that is perpendicular to said chuck-contacting side of said substrate.

21. The apparatus of claim 18 wherein said rod is configured to contact a top of said substrate, said top of said substrate representing a side that is opposite and parallel to said chuck-contacting side of said substrate.

22. The apparatus of claim 18 wherein said rod is disposed in an aperture in said chuck.

23. The apparatus of claim 22 wherein said rod is biased against said underside of said substrate using a lossy biasing arrangement, said lossy biasing arrangement being configured to substantially isolate vibrations from other components of said plasma chamber, other than from said substrate, from said rod.

24. The apparatus of claim 23 wherein said lossy biasing arrangement is a spring coupled to said rod.

25. The apparatus of claim 23 wherein said lossy biasing arrangement is a resilient material coupled said rod.

26. The apparatus of claim 23 wherein said resilient material is one of plastic and rubber.

* * * * *